US006765389B1

(12) United States Patent
Moore

(10) Patent No.: US 6,765,389 B1
(45) Date of Patent: Jul. 20, 2004

(54) METHOD OF COMPUTING AC IMPEDANCE OF AN ENERGY SYSTEM

(75) Inventor: Stephen W. Moore, Fishers, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/460,383

(22) Filed: Jun. 12, 2003

(51) Int. Cl.[7] .......................................... G01N 27/416
(52) U.S. Cl. ..................................................... 324/430
(58) Field of Search ................................ 324/430, 426, 324/429, 460, 433; 320/134, 132; 702/63, 64, 65; 703/13; 716/4

(56) References Cited

U.S. PATENT DOCUMENTS

| | | | |
|---|---|---|---|
| 4,697,134 A | 9/1987 | Burkum et al. | 320/134 |
| 6,002,238 A | 12/1999 | Champlin | 320/134 |
| 6,083,912 A | 7/2000 | Khouri | 429/231.8 |
| 6,291,097 B1 | 9/2001 | Barker et al. | 429/161 |
| 6,406,815 B1 | 6/2002 | Sandberg et al. | 429/231.95 |
| 6,413,668 B1 | 7/2002 | Sandberg et al. | 429/174 |
| 6,419,712 B1 | 7/2002 | Haverstick | 29/623.5 |
| 6,456,042 B1 | 9/2002 | Kwok | 320/134 |
| 6,466,026 B1 * | 10/2002 | Champlin | 324/430 |
| 6,566,883 B1 * | 5/2003 | Vonderhaar et al. | 324/426 |
| 6,617,078 B1 | 9/2003 | Chia et al. | 429/316 |

* cited by examiner

Primary Examiner—Pia Tibbits
(74) Attorney, Agent, or Firm—Jimmy L. Funke

(57) ABSTRACT

An energy system is formed of a plurality of battery cells, and has an application associated therewith that draws power from the energy system. As the application is being used, voltage and current measurements are taken at a predetermined rate, and stored in a history table to create a series of time-based measurements. The measurements stored in the history table are then processed to compute an impedance parameter value corresponding to the AC impedance of the energy system. This impedance parameter value is then stored in a memory buffer where it can be used to carry out various diagnostic and control functions.

15 Claims, 2 Drawing Sheets

METHOD OF COMPUTING AC IMPEDANCE OF AN ENERGY SYSTEM

TECHNICAL FIELD

The invention relates generally to energy-based systems, and in particular to a method of computing the AC impedance of these systems.

BACKGROUND OF THE INVENTION

It is known in many applications, including self-propelled vehicle applications as seen by reference to U.S. Pat. No. 6,394,208 entitled "STARTER/ALTERNATOR CONTROL STRATEGY TO ENHANCE DRIVEABILITY OF A LOW STORAGE REQUIREMENT HYBRID ELECTRIC VEHICLE" issued to Hampo et al., to employ a dynamoelectric machine in a first mode as a motor in order to provide propulsion torque. In such applications, it is also known to reconfigure the dynamoelectric machine in a second mode as a generator, in order to capture and convert some of the potential or kinetic energy associated with the application into output electrical power, a process known as regeneration ("regenerative energy"). Moreover, in such applications, it is also known to provide an energy system, such as a battery, to power the dynamoelectric machine when operated as a motor, and to receive the regenerative energy when the dynamoelectric machine is operated as a generator. In the latter case, the regenerative energy is generally operative to increase the state of charge of the battery, until such battery is "fully" charged. Battery technologies typically used in such applications include nickel metal hydride (NiMH), lead acid (PbA) and nickel cadmium (NiCd) technologies, although energy systems employing lithium chemistry technologies, while not as prevalent as other battery technologies, are also used in practice.

One aspect of the above systems that involves tradeoffs or compromises pertains to optimizing the performance of the energy system based on the condition of the energy system itself. One method of evaluating the condition of the energy system is by computing and analyzing the AC impedance of the energy system. As an energy system discharges its energy, its AC impedance rises meaning that the system is more resistant to giving up its remaining charge. The ability to compute this AC impedance can be beneficial for a number of reasons. By taking a "snapshot" of the impedance of the energy system immediately following the charging of the system, and then continuously computing the impedance as the system is used, the system operator can evaluate the condition of the energy system by comparing the two values, and therefore, observe whether the energy system is "fresh", or whether it is aging (e.g., losing energy storage capacity). Therefore, computing AC impedance is useful for diagnostics, energy system control, and in determining the condition of the energy system. It can allow the energy system controller to more accurately predict energy system behavior, which allows for more precise system control, enhanced performance, and more optimized charge and discharge profiles. It also allows for the system controller to compensate for energy system aging.

Current methods of computing the impedance of an energy system include using DC based measurements. These methods compute impedance by using two data points taken at very different currents, and then computing the impedance by calculating the difference of the voltage divided by the difference in the current. Other current methods include exciting the energy system with a low-level AC waveform, and then measuring the magnitude and phase of the resulting excitation current to compute the AC impedance. However, this method requires a separate circuit for generating the excitation waveform.

These existing methods, while adequate, do not allow for the most useful method of optimizing the AC impedance computation. Existing methods, as set forth above, do not provide for the "real time" computation of AC impedance without the addition of external hardware or specialized processes as the system is live in operation.

There is, therefore, a need for a process that allows the energy system to self-compute its AC impedance while it is live in operation that will minimize or eliminate one or more of the above-identified problems.

SUMMARY OF THE INVENTION

An object of the present invention is to solve one or more of the problems as set forth above. One advantage of the present invention is that the energy system, which may be formed of a fuel cell or any bi-directional energy storage devices such as lithium chemistry technologies, is able to continuously compute its AC impedance in "real time," thereby allowing it to constantly monitor and optimize its performance either while the energy system is "live" in operation, or while the system is "off-line." The present invention allows the energy system to perform internal complex impedance measurements to thereby determine the AC impedance of the energy system. This AC impedance computation then allows for improved diagnostics and control of the energy system.

Another advantage is that the measurements made in accordance with the present invention are done so in "real-time" as the system is live in operation without requiring any additional testing or monitoring circuitry, or any user interaction.

These and other features, objects, and advantages are realized by the present invention, which includes a method of computing the AC impedance of an energy system. The method includes measuring the electrical characteristics of power (i.e., current and voltage) drawn by a given application coupled to the energy system, and storing the measurements in the memory of the energy system. The method further includes processing the measurements to develop an impedance parameter value that is indicative of the energy system's AC impedance, and then storing this parameter value to a memory buffer.

An energy system according to the invention is also presented.

BRIEF DESCRIPTION OF THE DRAWINGS

The present invention will now be described by way of example, with reference to the accompanying drawings.

DESCRIPTION OF PREFERRED EMBODIMENT

Figure 1:
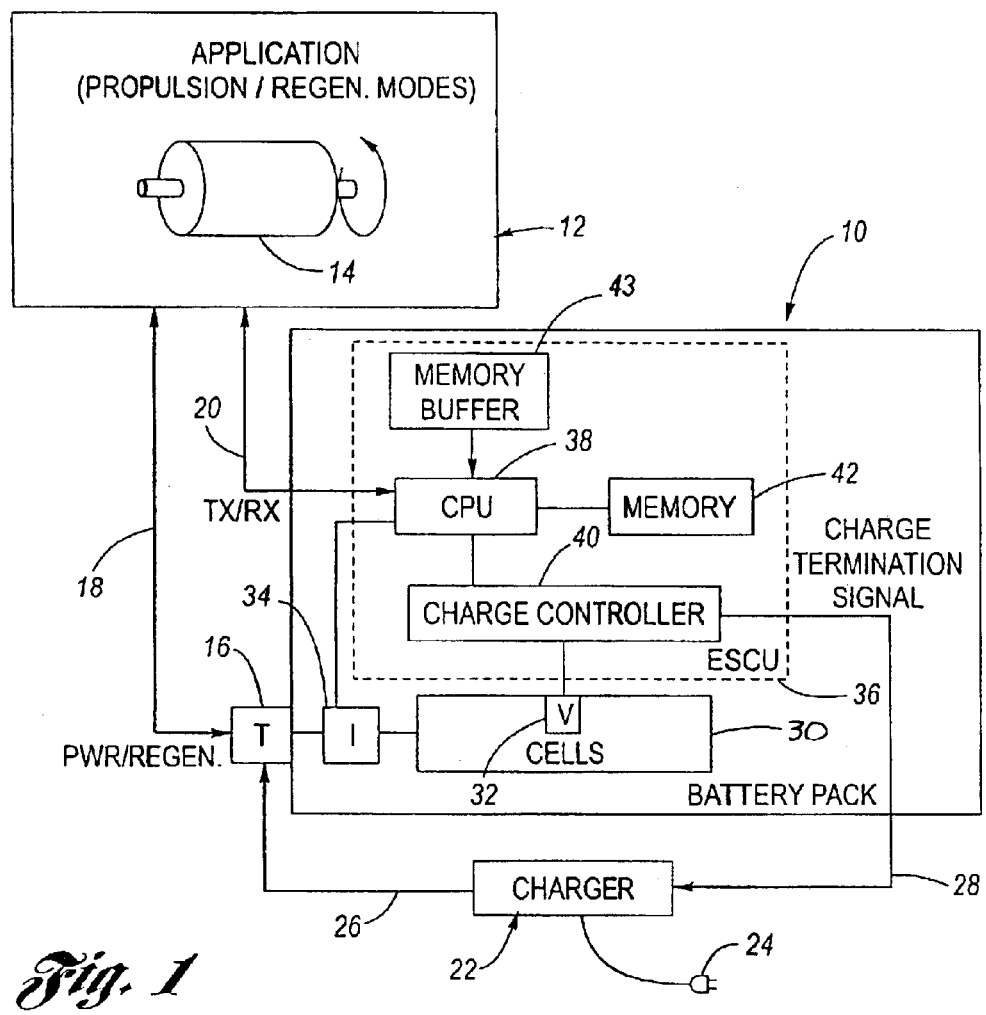
FIG. 1 is a simplified schematic and block diagram view of an energy system according the present invention, in an exemplary embodiment.

Referring now to the drawings wherein like reference numerals are used to identify identical components in the various views, FIG. 1 is a simplified, schematic and block diagram view of an inventive energy system 10 according to the invention suitable for use in connection with any one or more of a plurality of exemplary applications 12. Application 12, in the illustrated embodiment, may be of the type employing a dynamoelectric machine 14, which may alternatively be configured for operation (i) in a first mode wherein the machine 14 is used for propulsion torque, or (ii) in a second mode different from the first mode wherein the machine 14 is configured for the production of regenerative energy (i.e., it is configured as a generator). For example, such applications may include, but are not limited to, self-propelled vehicle applications, although other applications stationary in nature (i.e., rotating systems having loads with inertia, and nonrotating systems with dynamic loads) are also included within the spirit and scope of the invention. Dynamoelectric machine 14 may comprise conventional apparatus known to those in the art, for example only, AC or DC electric motors, brush-based or brushless electric motors, electromagnet or permanent magnetic based electric motors, reluctance-based electric motors, or the like. It should be clearly understood that the foregoing is exemplary only and not limiting in nature.

Energy system 10 includes a means for measuring and analyzing predetermined electrical characteristics of power, such as voltage and current, drawn by application 12 from energy system 10 as a function of time. Energy system 10 further includes a means for using such measurements and analysis to allow energy system 10 to self-compute its AC impedance, which in turn allows energy system 10 to more optimally perform diagnostics and control functions to more accurately predict energy system performance. The present invention is, therefore, adapted to establish a way for energy system 10 to maximize performance by continuously self-computing its AC impedance rather than by employing external hardware and specialized processes. By utilizing the functionality of this invention, users of energy system 10 are thereby able to extract optimal performance from energy system 10 that is otherwise unattainable.

With continued reference to FIG. 1, energy system 10 may include an input/output terminal 16, designated "T" (for Terminal) in the drawings. A power bus 18, designated "PWR/REGEN." in the drawings, is configured to allow electrical power to be drawn for energy system 10 when dynamoelectric machine 14 is operated in a first, propulsion torque mode. Power bus 18 alternatively may be configured or used to carry electric energy, hereinafter referred to as regenerative energy, produced by dynamoelectric machine 14 when operated in the second, regenerative energy production mode (as a generator). As further shown, in the illustrated embodiment, energy system 10 may also include a communications port configured for connection to a communications line 20, designated "TX/RX" (transmit/receive) in FIG. 1. Communications line 20 may be configured for bi-directional communications, for example control signals or control messages, between energy system 10 and application 12.

FIG. 1 also shows an electrical battery charger 22, including in exemplary fashion a conventional electrical plug 24 for connection to a wall outlet (not shown) or the like. Charger 22 is configured for charging (or recharging) energy system 10. Charger 22 includes a charging power line 26 configured for connection to energy system 10 for charging (or recharging) the storage devices making up energy system 10, although for simplicity sake, line 26 is shown connected to the I/O terminal 16 (PWR/REGEN.). In addition, charger 22 may have an input configured to receive a control signal, such as a charge termination signal, on a control line 28 from energy system 10. The charge termination signal on line 28 is configured to cause charger 22 to discontinue charging energy system 10 (i.e., to stop charging). Alternatively, charger 22 may be variable charger 22 wherein the control signal on line 28 is operative to adjust the charging current as well as to terminate the charge current. Charger 22 may comprise conventional charging componentry known to those of ordinary skill in the art.

In the illustrated embodiment, energy system 10 includes one or more battery cells 30, at least one voltage monitoring device 32, at least one current monitoring device 34 and an energy system control unit (ESCU) 36. ESCU 36 may include a central processing unit (CPU) 38, a charge controller 40, a memory 42, and a memory buffer 43.

Cells 30 are configured to produce electrical power, and may be arranged so that the collective output thereof is provided on I/O terminal 16, as in the illustrated embodiment. Conventional electrical current flows out of terminal 16 to the load (i.e., the dynamoelectric machine 14) in application 12. Cells 30 are also configured to be rechargeable, for example, by receiving conventional electrical current into energy system 10 at I/O terminal 16. The recharging current may be from either charger 22 or from machine 14 operating as a generator. Cells 30 may comprise conventional apparatus according to known bi-directional energy storage systems, such as the battery technologies described in the Background, for example, NiMH, PbA, or NiCd, or the like. Cells 30 may also comprise electrical generation devices such as fuel cells. In a preferred embodiment, however, cells 30 comprise cells formed in accordance with various Lithium chemistries known to those of ordinary skill in the energy storage art. In the illustrated embodiment, cells 30 are arranged to produce a direct current (DC) output at a predetermined, nominal level (e.g., 80 volts at 100% of full state of charge). This is, of course, exemplary and not limiting in nature.

Voltage monitoring device 32 is configured to measure the voltage level being drawn by application 12 from energy system 10, and to produce a voltage indicative signal representative of the detected voltage. In one embodiment, one voltage monitoring device 32 is provided to detect the overall voltage output of the combination of cells 30. In a preferred embodiment, however, a plurality of voltage monitoring devices 32 (the plurality not being shown for clarity) are employed, at least one for each individual cell included in energy system 10. Voltage monitoring device(s) 32 may comprise conventional apparatus known in the art.

Current monitoring device 34 is configured to detect the current level being drawn by application 12 from energy system 10, and to generate, in response, a current indicative signal representative of the measured current level. Current monitoring device 34 may comprise conventional apparatus known in the art.

Energy System Control Unit (ESCU) 36 is configured for controlling the overall operation of energy system 10. ESCU 36 may include a central processing unit (CPU) 38, a charge controller 40, and a memory 42.

CPU 38 may comprise conventional processing apparatus known in the art, capable of executing preprogrammed instructions stored in memory 42, all in accordance with the functionality as described in greater detail below. In this regard, memory 42 is coupled to CPU 38, and may comprise conventional memory devices, for example, a suitable combination of volatile, and non-volatile memory so that main line software can be stored and further allow processing of dynamically produced data and/or signals.

Figure 2:
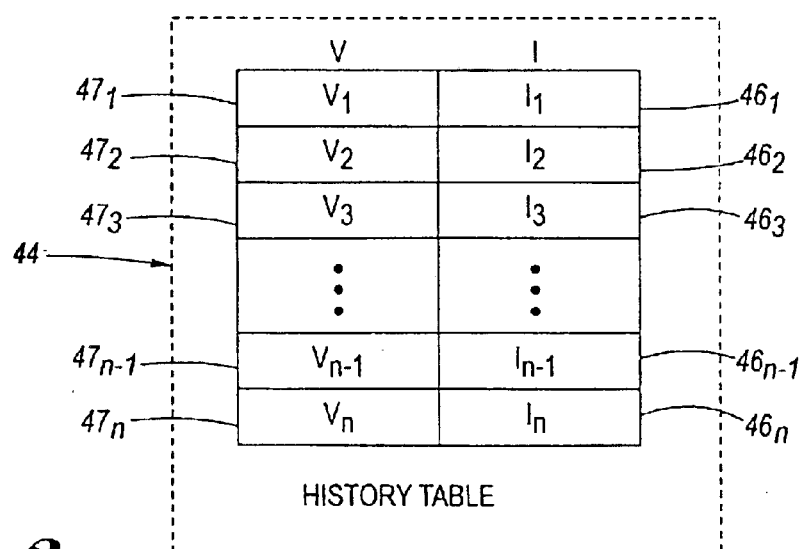
FIG. 2 is a diagrammatic view showing, in greater detail, a table portion of the memory shown in FIG. 1.

FIG. 2 shows a data structure, namely, a history table 44, which is configured to store a plurality of voltage measurements $V_1, V_2, V_3, \ldots, V_{(n-1)}, V_n$, respectively designated $46_1, 46_2, 46_3, \ldots, 46_{(n-1)}, 46_n$; and a plurality of current measurements $I_1, I_2, I_3, \ldots, I_{(n-1)}, I_n$, respectively designated $47_1, 47_2, 47_3, \ldots, 47_{(n-1)}, 47_n$. The history table 44 is a mechanism through which a series of time-based voltage and current measurements can be recorded and stored. In one embodiment, history table 44 comprises a First In, First Out (FIFO) buffer having a finite length (e.g., 6 entries, 8 entries, 10 entries, etc.). The length of the buffer may be selected to reflect the responsiveness of the method changes. Each entry corresponds to the respective time-based voltage and current measurements taken by the voltage monitoring device 32 and current monitoring device 34 over a period of time. It should be understood, however, that other approaches are possible and yet remain within the spirit and scope of the present invention.

Figure 3:
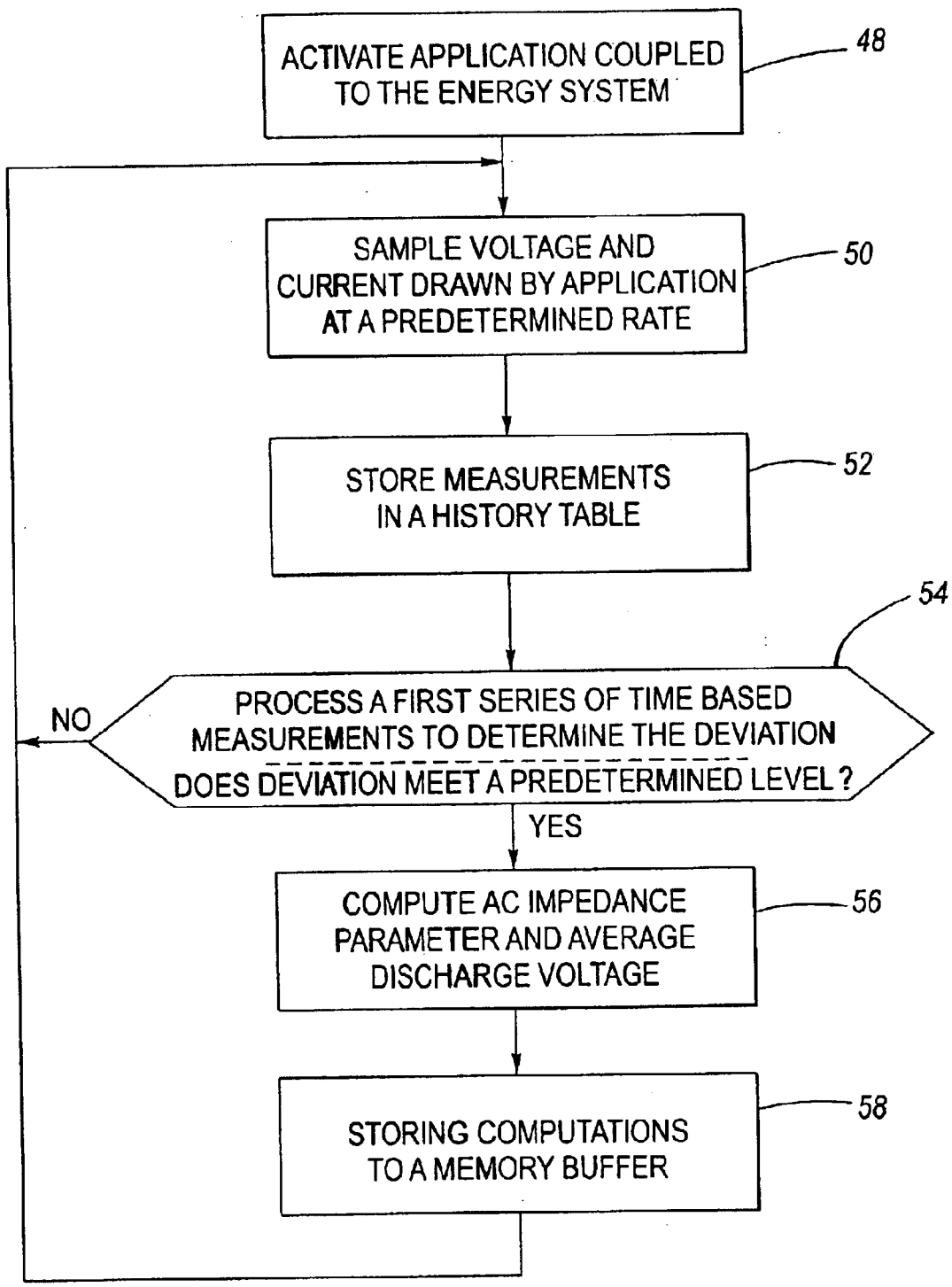
FIG. 3 is a flowchart diagram illustrating a method in accordance with the present invention.

Referring now to FIGS. 1–3, a method in accordance with the present invention will now be set forth. It should be understood that the following functionality, unless specifically described with respect to a particular structure of the illustrated embodiment of FIG. 1, or which has already been specifically described in connection with a specific structure of FIG. 1, may be implemented in software suitable for execution by CPU 38.

Referring specifically to FIG. 3, in step 48, an application 12 coupled to energy system 10 is provided for and activated. Application 12 may include operating a hybrid vehicle or an electric vehicle, however, these applications are merely exemplary and not the invention is not limited to these uses. Energy system 10 may be formed to include a battery comprised of a plurality of cells 30. These plurality of cells 30 may include lithium chemistry salts, however, cells 30 are not limited to this type of composition.

In step 50, voltage monitoring device 32 and current monitoring device 34 simultaneously sample and measure the voltage and current being drawn by application 12 from energy system 10 at a predetermined time rate. This is an iterative step in the method that results in the accumulation of a series of time-based measurements.

In step 52, these measurements are stored in history table 44 as they are taken, and designated accordingly (i.e., $V_1$, $V_2$, etc. . . and $I_1, I_2$, etc. . . ). It should be appreciated that on the first loop through steps 50–52, history table 44 only contains one set of voltage and current measurements. However, through subsequent sampling of the power drawn by application 12, history table 44 will become fully populated. In one embodiment, the earliest measurements in history table 44 will be pushed out and discarded. This particular implementation has the effect of "time" filtering out "old" voltage and current measurements.

In step 54, CPU 38 causes the values from a first series of time-based measurements stored in history table 44 to be processed in order to determine the deviation between the first series of time-based measurements and a previously stored series of time-based measurements.

In step 56, if this deviation is found to not meet a predetermined level, then the process returns to step 50 and repeats itself In effect, a relatively small deviation corresponds more closely to a DC condition of operation of the energy system, rather than a dynamic (i.e., changing) condition suitable for determining AC electric impedance characteristics.

If, however, the deviation exceeds a predetermined acceptable level, then an impedance parameter value indicative of an AC impedance of energy system 10 and the average discharge voltage of the energy system are computed. The impedance parameter value and the average discharge voltage can be computed in a number of ways. In one preferred approach, the applicable voltage and current measurements stored in history table 44 are processed using a least squares algorithm as known in the art, to determine the slope and intercept of the particular measurements. The computed slope is interpreted as the AC impedance of energy system 10, and the computed intercept is interpreted as the average discharge voltage of energy system 10. While this approach can be used to carry out these calculations, it should be noted that the calculations can be carried out using other approaches and that this approach is exemplary only and not limiting in nature.

In step 58, the impedance parameter and open circuit voltage values are stored in a memory buffer 43. This stored value can then be communicated to internal or external sources for various diagnostic and control applications. In addition, a series of AC impedance parameter values can be stored in memory buffer 43. Such series can be analyzed to monitor trends in the operation of the battery.

While this method has been described with respect to an overall energy system 10, in an alternate embodiment, this method can be carried out with respect to an individual storage device(s) of the energy system 10. In particular, energy system 10 may include a plurality of battery cells 30. It should therefore be understood that one cell in the battery pack may have a higher or lower AC impedance parameter value than another, and each cells impedance parameter may be determined and recorded in the manner described above pertaining the system as a whole. Thus, the AC impedance computation process should be understood to apply to either the overall battery pack, or the one or more particular cells within the battery pack, or some combination of the foregoing, all as the circumstances of the particular battery pack and cells (i.e., battery technology, charging capability, etc.) being used may require.

In accordance with the present invention, an energy system formed of lithium chemistry technologies is coupled to an application which draws power from the energy system. While the application is in use, the voltage and current being drawn from the energy system by the application are sampled and measured at a predetermined rate. These measurements are then stored in a history table within the energy system, and are used to create a running series of time-based measurements. A first series of these measurements are then processed in order to determine whether a predetermined level of deviation exists between the series of measurements and the previously stored series of measurements. If the appropriate deviation level is met, then an impedance parameter value and the average discharge voltage associated with the energy system are calculated. These calculations are then stored in a memory buffer, where they can then be used for various diagnostic and control functions either internal or external to the energy system.

What is claimed is:

1. A method for computing the AC impedance of an energy system, comprising the steps of:
    providing and activating an application coupled to the energy system;
    measuring electrical characteristics associated with the energy system as power is drawn by the application from the energy system as a function of time by sampling the electrical characteristics at a predetermined rate to produce and define a series of time-based measurements;

storing the series of time-based measurements in a history table;

processing the series of time-based measurements to determine an impedance parameter value indicative of an AC impedance of the energy system; and storing the determined impedance parameter value.

2. The method of claim 1 wherein said measuring step includes the substeps of:

selecting the electrical characteristics sampled in said sampling step from the group comprising a voltage level and a current level; and sampling the voltage and current levels.

3. The method of claim 1 wherein the measuring step further includes the substeps of:

establishing said history table to have a first-in value entry and a last-in value entry, with a predetermined number of value entries inbetween; and displacing the first-in value entry with each subsequent measurement.

4. The method of claim 1 wherein the processing step further includes the substeps of:

determining a deviation between the most recent time-based measurement and the series of stored time-based measurements; and calculating the impedance and open circuit voltage of the energy system when the deviation meets a predetermined acceptable level.

5. The method of claim 4 wherein the calculating step further includes calculating the impedance and open circuit voltage by computing the slope and intercept of the series of time based measurements.

6. The method of claim 5 wherein the calculating step further includes computing the slope and by applying a least squares algorithm to said series of time based measurements.

7. A method for computing the AC impedance of an energy system, comprising the steps of:

forming the energy system so as to include a battery comprising a plurality of cells made up of lithium chemistry salts;

providing and activating an application coupled to the energy system;

measuring electrical characteristics associated with the energy system as power is drawn by the application from the energy system as a function of time to define a series of time-based measurements;

processing the series of time-based measurements to determine an impedance parameter value indicative of an AC impedance of the energy system; and storing the determined impedance parameter value.

8. The method of claim 7, wherein the measuring step further includes the substep of determining the electrical characteristics of each of the plurality of cells.

9. A method for computing the AC impedance of an energy system, comprising the steps of:

providing a dynamoelectric machine coupled to the energy system;

operating the dynamoelectric machine whereby power is drawn from the energy system;

measuring the voltage and current drawn by the dynamoelectric machine from the energy system as a function of time;

sampling the voltage and current drawn from the energy system at a predetermined rate to produce a series of time-based measurements;

storing the measurements in a history table within the energy system;

determining a deviation between the most recent measurement and the series of time-based measurements stored in the history table;

calculating the impedance and open circuit voltage of the energy system when the deviation meets a predetermined acceptable level to determine an impedance parameter value indicative of the AC impedance of the energy system; and storing the determined impedance parameter and open circuit voltage values.

10. The method of claim 9 wherein the step of providing an energy system further includes the step of forming an energy system so as to include a battery comprising a plurality of cells.

11. The method of claim 10 wherein the forming step is performed by the substep of producing the plurality of cells so as to employ lithium chemistry salts.

12. The method of claim 9 wherein the measuring step further includes the step of determining the voltage and current of each of the plurality of cells.

13. The method of claim 9 wherein the processing step further includes the substeps of:

establishing said history table to have a first-in value entry and a last-in value entry, with a predetermined number of value entries inbetween;

displacing the first-in value entry with each subsequent measurement.

14. The method of claim 9 wherein the calculating step further includes calculating the impedance and open circuit voltage by calculating a slope and intercept of the series of time based measurements.

15. The method of claim 14 wherein the calculating step further includes the calculating of said slope and intercept by applying the least squares method as known in the art.

* * * * *